(12) United States Patent
Sung et al.

(10) Patent No.: US 10,348,919 B2
(45) Date of Patent: Jul. 9, 2019

(54) COVERING STRUCTURE FOR CABLE

(71) Applicant: Kinpo Electronics, Inc., New Taipei (TW)

(72) Inventors: Hung-Huan Sung, New Taipei (TW); Sung-Po Lin, New Taipei (TW); Chung-Hsin Wei, New Taipei (TW)

(73) Assignee: Kinpo Electronics, Inc., New Taipei (TW)

( * ) Notice: Subject to any disclaimer, the term of this patent is extended or adjusted under 35 U.S.C. 154(b) by 0 days.

(21) Appl. No.: 15/976,841

(22) Filed: May 10, 2018

(65) Prior Publication Data

US 2019/0089852 A1    Mar. 21, 2019

(30) Foreign Application Priority Data

Sep. 21, 2017 (TW) .............................. 106132490 A (51) Int. Cl.
| | |
|---|---|
| *H05K 7/00* | (2006.01) |
| *H04N 1/00* | (2006.01) |
| *H05K 5/03* | (2006.01) |
| *H05K 5/02* | (2006.01) |
| *H05K 5/00* | (2006.01) |
| *H02G 11/00* | (2006.01) |

(52) U.S. Cl.
CPC ......... *H04N 1/00554* (2013.01); *H02G 11/00* (2013.01); *H04N 1/0083* (2013.01); *H05K 5/0021* (2013.01); *H05K 5/0226* (2013.01); *H05K 5/0247* (2013.01); *H05K 5/03* (2013.01)

(58) Field of Classification Search
USPC ........................................................ 361/729
See application file for complete search history.

(56) References Cited

U.S. PATENT DOCUMENTS

| | | | | |
|---|---|---|---|---|
| 6,499,189 | B2* | 12/2002 | Kondo ...................... | E05D 3/06 16/239 |
| 2007/0047024 | A1* | 3/2007 | Onose ................ | H04N 1/00519 358/474 |
| 2009/0225375 | A1* | 9/2009 | Iwata ................... | G03G 15/605 358/474 |

* cited by examiner

*Primary Examiner* — Hung S. Bui
(74) *Attorney, Agent, or Firm* — JCIPRNET (57) ABSTRACT

A covering structure for cable adaptable for connecting between a first and a second electronic modules that are electrically connected via a cable. When the first electronic module is pivoted relative to the second electronic module to be opened, a portion of the cable is exposed outside the first and the second electronic modules. The covering structure for cable includes a cover, a first shaft, and a second shaft. The first shaft is disposed on one side of the cover and pivoted to the first electronic module; the second shaft is disposed on an opposite side of the cover and pivoted to the second electronic module. The first electronic module is opened/closed relative to the second electronic module and drives the cover such that the cover covers a portion of the cable that is exposed outside the first and the second electronic modules when being opened.

12 Claims, 6 Drawing Sheets

COVERING STRUCTURE FOR CABLE

CROSS-REFERENCE TO RELATED APPLICATION

This application claims the priority benefit of Taiwan application serial no. 106132490, filed on Sep. 21, 2017. The entirety of the above-mentioned patent application is hereby incorporated by reference herein and made a part of this specification.

TECHNICAL FIELD

The disclosure is related to a covering structure for cable.

DESCRIPTION OF RELATED ART

Along with advancement of technologies, there are various types of peripheral machines (or office machine or multi-function printer (MFP)) available in the market that are integrated with copying, printing and scanning functions to make it convenient for users to carry out document processing work.

The type of peripheral machines that serve the above-mentioned functions are generally combined via modules stacked together. Therefore, when using this type of peripheral machines, it is required to open the cover (to be in an unfolded state) or close the cover on a base, or open one of the electronic modules or close it on another electronic module.

SUMMARY

The disclosure provides a covering structure for cable which is capable of providing covering and protecting effect for cable in the process of opening/closing an electronic module.

In the disclosure, the covering structure for cable is adaptable for connecting between a first electronic module and a second electronic module. The first electronic module is adaptable for being pivoted relative to the second electronic module to be opened/closed. The first electronic module and the second electronic module are electrically connected via a cable; when the first electronic module is pivoted relative to the second electronic module to be opened, a portion of the cable is exposed outside the first electronic module and the second electronic module. The covering structure for cable includes a cover, a first shaft and a second shaft. The first shaft is disposed on one side of the cover, and the cover is pivoted to the first electronic module via the first shaft. The second shaft is disposed on another side of the cover relative to the first shaft, and the cover is movably pivoted to the second electronic module via the second shaft. In the process that the first electronic module is opened/closed relative to the second electronic module, the cover is driven via the first shaft and the second shaft such that the cover covers the portion of the cable exposed outside the first electronic module and the second electronic module when the first electronic module is opened relative to the second electronic module.

In summary, the covering structure for cable consists of at least one cover, the first shaft and the second shaft, wherein the cover is pivoted to the first electronic module via the first shaft, and the cover is movably pivoted to the second electronic module via the second shaft; therefore, the cover is driven at the same time when the first electronic module is pivoted relative to the second electronic module to be opened/closed. Accordingly, when the first electronic module is opened (or unfolded) relative to the second electronic module, the cable that is electrically connected between the first electronic module and the second electronic module is exposed. Nevertheless, since the cover is driven at the same time, the portion of the cable that is exposed can be covered. In this manner, the cover is capable of providing the covering and protecting function for the appearance of cable so as to prolong the service life of the cable as well as enhance appearance of the electronic module.

In order to make the aforementioned features and advantages of the invention more comprehensible, embodiments accompanying figures are described in detail below.

DESCRIPTION OF EMBODIMENTS

Figure 1:
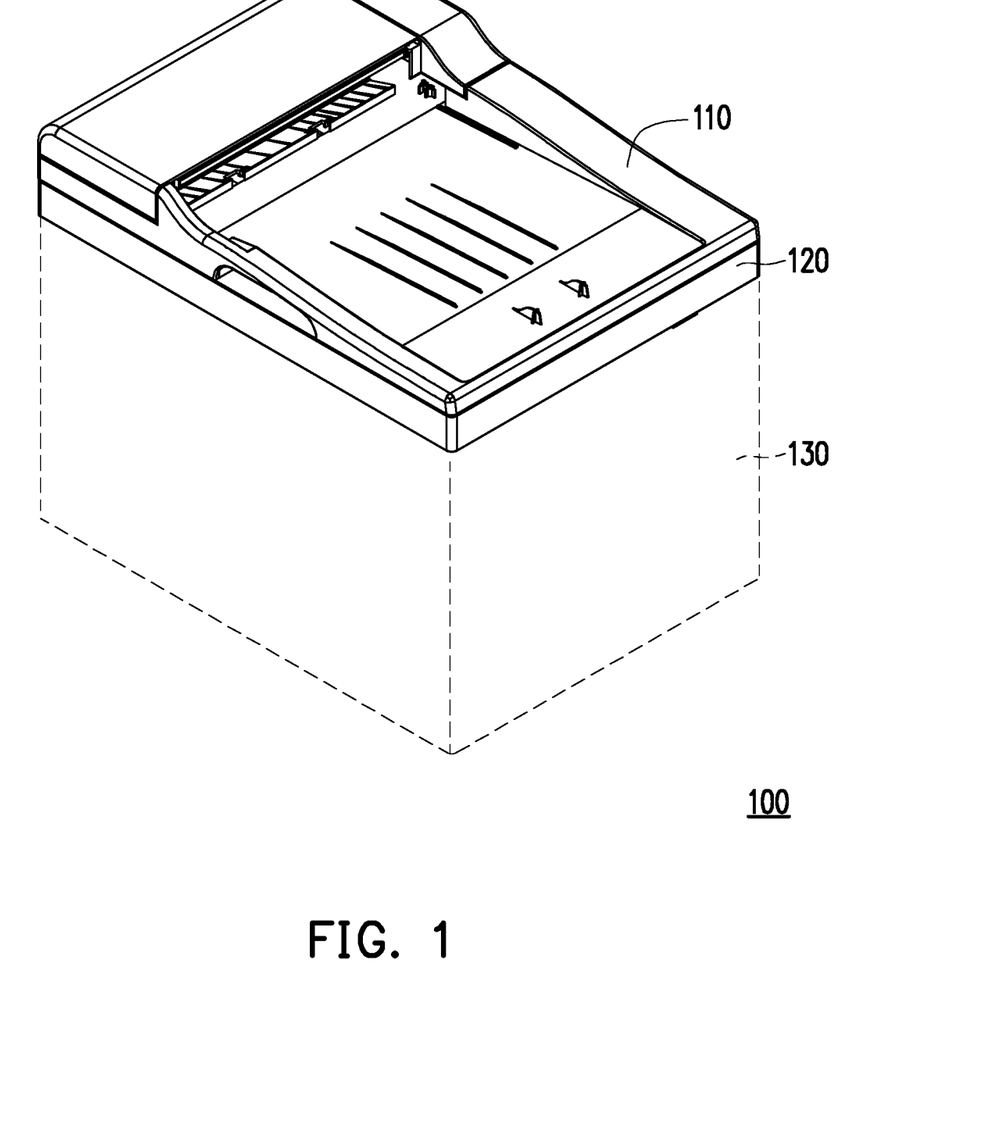
FIG. 1 is a schematic view of a peripheral machine according to an embodiment of the disclosure.
Figure 2:
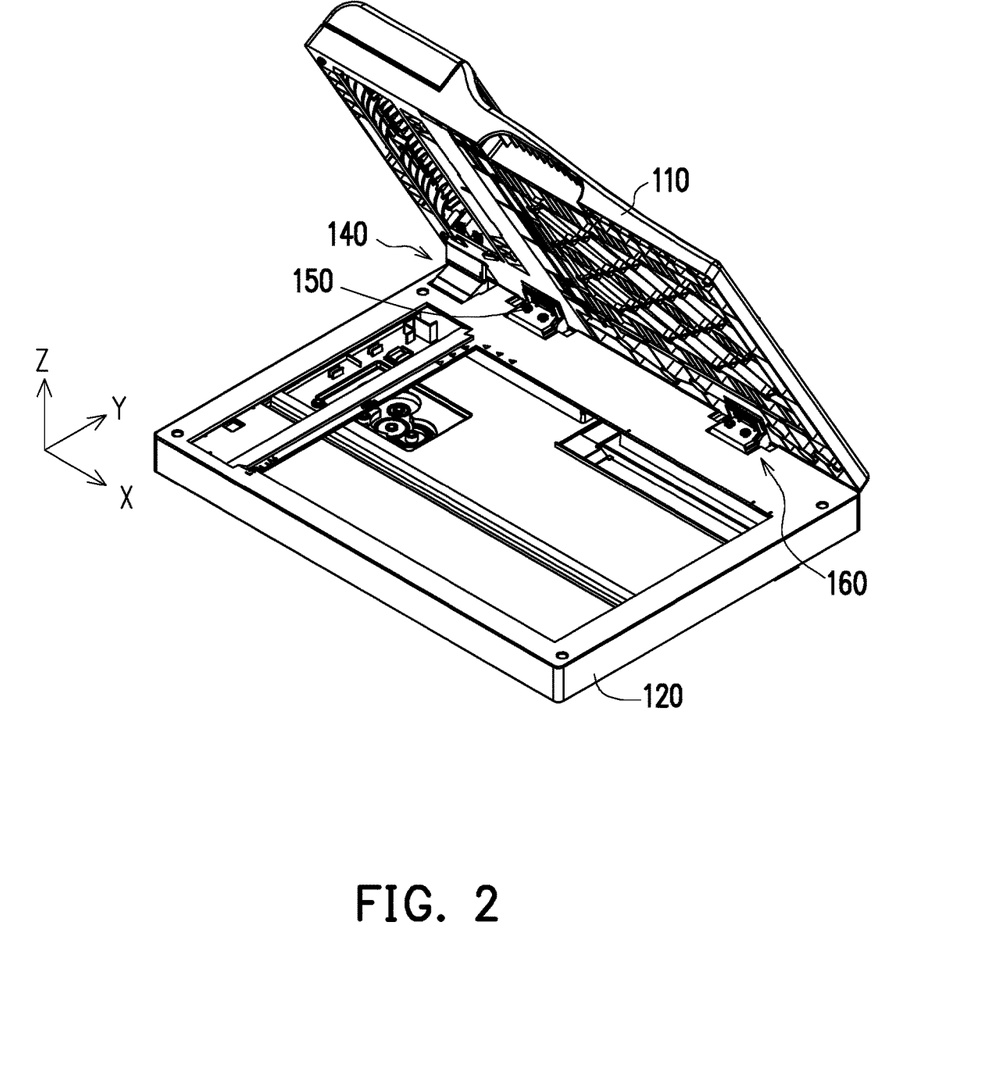
FIG. 2 is a schematic view illustrating another state of a portion of the structure of the peripheral machine in FIG. 1.
Figure 3:
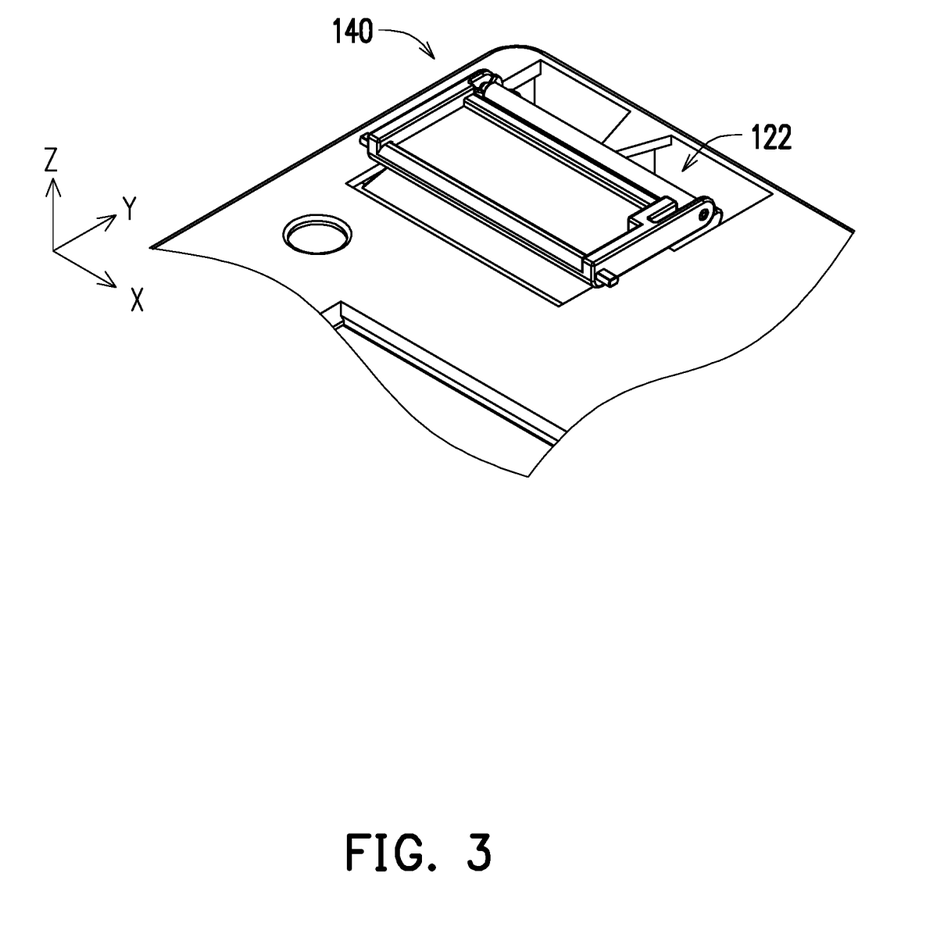
FIG. 3 is an enlargement view of a partial structure of the peripheral machine in FIG. 1.

FIG. 1 is a schematic view of a peripheral machine according to an embodiment of the disclosure. FIG. 2 is a schematic view illustrating another state of a portion of the structure of the peripheral machine in FIG. 1. FIG. 3 is an enlargement view of a partial structure of the peripheral machine in FIG. 1. Here, a Cartesian coordinate X-Y-Z is provided in some of the drawings for ease of illustration of related components.

Referring to FIG. 1 to FIG. 3, a peripheral machine 100 includes a base 130, a first electronic module 110 and a second electronic module 120 stacked on the base 130, wherein the first electronic module 110 is, for example, an automatic document feeder (ADF) of the peripheral machine 100, and the second electronic module 120 may be a scanner or a copy machine of the peripheral machine 100, and the base 130 may be provided with a medium (e.g., paper) accommodating space and a printer module (not shown) therein so as to cooperate with the first electronic module 110 and the second electronic module 120 to perform various peripheral functions such as making copies, printing, scanning and so on; all of the functions can be derived from known technologies and thus no further descriptions are incorporated herein. Furthermore, the second electronic module 120 is substantially fixed on the base 130, and the first electronic module 110 is capable of being substantially pivoted relative to the second electronic module 120 along a pivotal axial direction so as to achieve the effect that the first electronic module 110 can be opened (unfolded)/closed (folded) relative to the second electronic module 120. In other words, in the embodiment, the first electronic module 110 as an ADF is regarded as a dynamic object, and the second electronic module 120 as a scanner is regarded as a static object.

Referring to the closing state shown in FIG. 1 and the opening state shown in FIG. 2, the second electronic module 120 has a supporting plane. As shown in FIG. 2, the supporting plane of the second electronic module 120 may be substantially regarded as an X-Y plane. Moreover, at least one hinge (two hinges 150 and 160 are illustrated for exemplary purpose, which should not be construed as a limitation to the disclosure) is connected between the first electronic module 110 and the second electronic module 120. The first electronic module 110 is pivoted relative to the second electronic module 120 along the pivotal axial direction (which may be regarded as X-axis) via the hinges 150 and 160 so as to achieve the required opening/closing state. Here, the hinges 150 and 160 not only enable the first electronic module 110 and the second electronic module 120 to be pivoted relative to each other, the structure (not shown) thereof also provides a supporting force so that the first electronic module 110 can be maintained in an opening state (as shown in FIG. 2) and to maintain opened at a random angle. When the first electronic module 110 is closed on the second electronic module 120, the first electronic module 110 substantially leans against the supporting plane, i.e., the X-Y plane.

Figure 4:
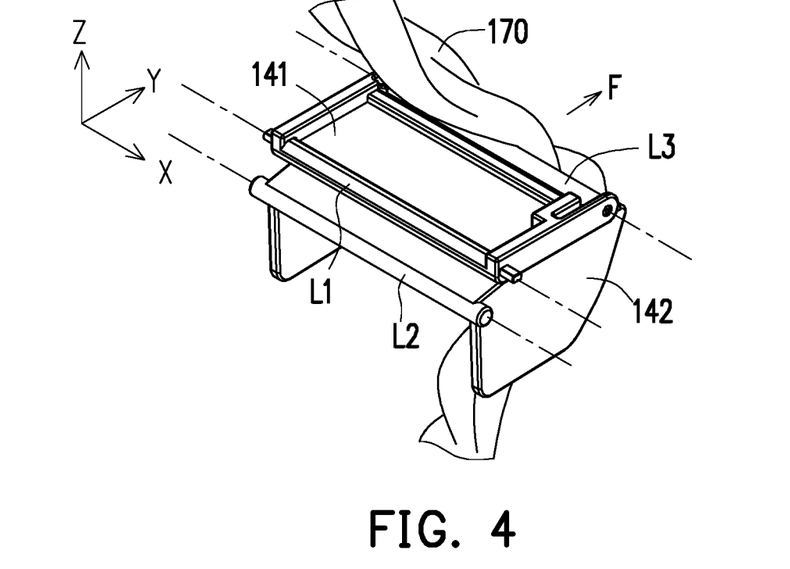
FIG. 4 and FIG. 5 are schematic views respectively illustrating a portion of components of the peripheral machines in FIG. 1 and FIG. 2.
Figure 5:
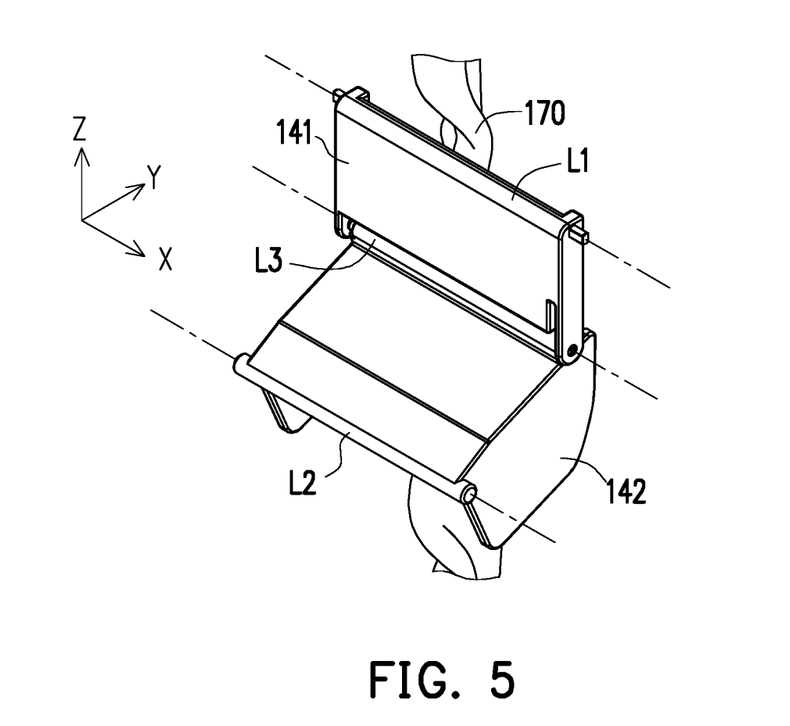

FIG. 4 and FIG. 5 are schematic views respectively illustrating a portion of components of the peripheral machines in FIG. 1 and FIG. 2 for describing the feature of related components in the pivotal axial direction, wherein FIG. 4 is illustrated in corresponding to the states shown in FIG. 1 and FIG. 3, and FIG. 5 is illustrated in corresponding to the state in FIG. 2. Here, the first electronic module 110 and the second electronic module 120 are electrically connected with each other via a cable 170, and thus electrically connected to a control system (not shown) of the peripheral machine 100 so as to achieve the above-mentioned functions.

However, it should not pointed out that, since the hinges 150 and 160 are configured to provide the supporting force required by the first electronic module 110, the hinges are closely configured in structure (compact structure) and there is no sufficient space for the cable 170 to pass through. In the meantime, if the cable 170 passes through the force-receiving structure region such as hinges 150 and 160, there is a risk that the cable 170 might be damaged due to being subjected to the force indirectly. Therefore, in the technical field related to the peripheral machine 100, it is not likely to take the risk of letting the cable 170 that is electrically connected between the electronic modules 110 and 120 to be configured in the manner of passing through the hinges 150 and 160. Thus, the designer substantially would dispose the cable 170 at a position different from the hinges 150 and 160 on the peripheral machine 100.

In this manner, when the first electronic module 110 is opened (unfolded as shown in FIG. 2) relative to the second electronic module 120, a portion of the cable 170 is exposed outside the first electronic module 110 and the second electronic module 120 accordingly, and there is still a risk of exposure and the damage could easily occur. Therefore, the peripheral machine 100 in the embodiment further includes a covering structure for cable 140 which includes a cover and a plurality of shafts for providing a covering and protecting effect for the portion of the cable 170 that is exposed. In the other way around, the covering structure for cable 140 may be regarded as being disposed between the first electronic module 110 and the second electronic module 120 of the peripheral machine 100 at a position different from the hinges 150 and 160.

Furthermore, in the embodiment, the covering structure for cable 140 includes a first cover 141, a second cover 142, a first shaft L1, a second shaft L2 and a third shaft L3, wherein the first cover 141 is pivoted to the first electronic module 110 via the first shaft L1, the second cover 142 is movably pivoted to the second electronic module 120 via the second shaft L2, and the first cover 141 and the second cover 142 are pivoted together via the third shaft L3. As shown in FIG. 4 and FIG. 5, the first shaft L1, the second shaft L2 and the third shaft L3 are parallel with each other (all of them are parallel with X-axis); therefore, looking from a side viewing angle, they may be regarded as a linkage structure. Here, it should be specified that the first shaft L1 is substantially disposed on the first cover 141 so as for the first cover 141 to be pivoted to the first electronic module 110; the second shaft L2 is substantially disposed on the second cover 142 so as for the second cover 142 to be movably pivoted to the second electronic module 120; and the third shaft L3 is substantially disposed on the second cover 142 so as for the second cover 142 to be pivoted to the first cover 110. However, the embodiment provides no limitation to the configuration of the shafts. In other words, the way that the first shaft L1, the second shaft L2 and the third shaft L3 are disposed on the first cover 110, the second cover 120 or the first electronic module 110, the second electronic module 120 can be changed as appropriate depending on the needs. It should be pointed out that the first shaft L1 is pivoted to the first electronic module 110 in a fixed manner (not movable), and the second shaft L2 is movably pivoted to the second electronic module 120, wherein the "pivoted in a fixed manner" refers to that there is no room for movement at the position where the components are pivoted together.

Figure 6:
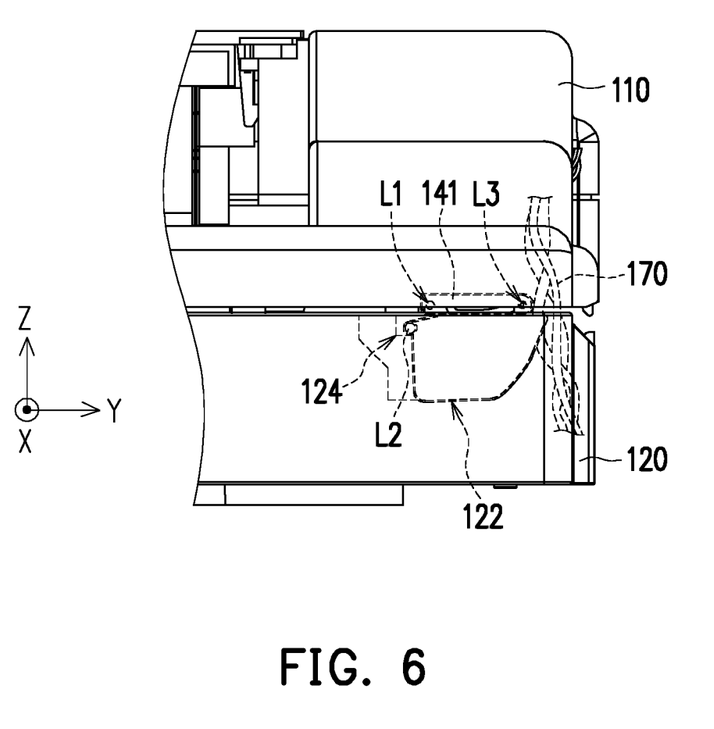
FIG. 6 and FIG. 7 are side views respectively illustrating the peripheral machines in FIG. 1 and FIG. 2.
Figure 7:
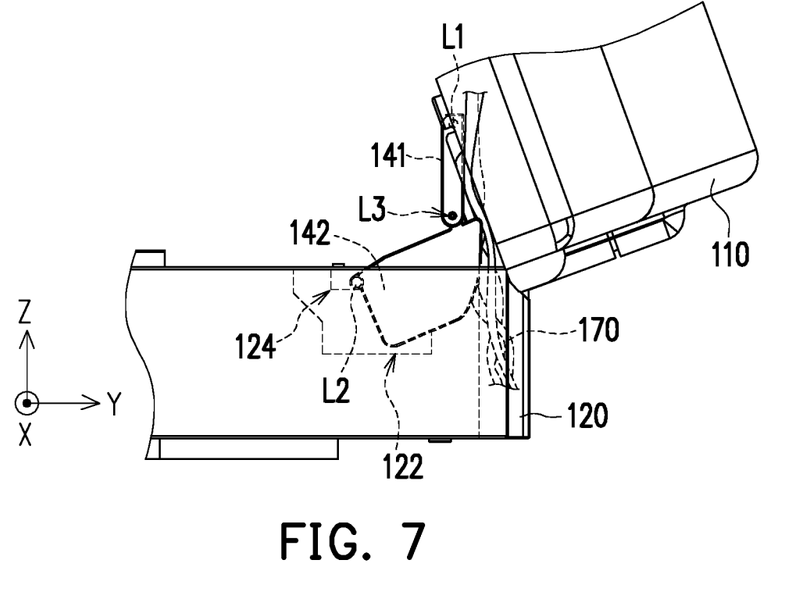

FIG. 6 and FIG. 7 are side views respectively illustrating the peripheral machines in FIG. 1 and FIG. 2. Referring to FIG. 4 to FIG. 7, specifically, the second electronic module 120 has a recess 122 and a track 124 disposed in the recess 122, wherein the track 124 is substantially parallel with the supporting plane (X-Y plane) of the second electronic module 120, and the track 124 is lower than the supporting plane and has a stage. When the first electronic module 110 is closed on the supporting plane of the second electronic module 120, the second cover 142 is substantially driven accordingly to be moved into the recess 122 as shown in FIG. 6. When the first electronic module 110 is opened relative to the second electronic module 120, the first electronic module 110 drives the first cover 141 and also brings the second cover 120 such that the second cover 142 is lifted from the recess 122. In this manner, as shown in FIG. 2, the first cover 141 and the second cover 142 are driven so that the covering and protecting functions for the cable 170 can be provided smoothly. That is, in the state shown in FIG. 2, the cable 170 is still hidden behind the first electronic module 110 and the second electronic module 120 as well as the first cover 141 and the second cover 142, and the user does not see the cable 170 directly. Furthermore, an orthogonal projection of the first shaft L1 on the supporting plane, an orthogonal projection of the second shaft L2 on the supporting plane and an orthogonal projection of the pivotal axial direction (i.e., X-axis mentioned above) of the first electronic module 110 and the second electronic module 120 on the supporting plane are respectively perpendicular to an orthogonal projection of the track 124 on the supporting plane.

Further referring to FIG. 4 and FIG. 5, when the first electronic module 110 is closed on the second electronic module 120, the first cover 141 is driven by the first electronic module 110 to be stacked on the second cover 142. At this time point, as compared with the lifting state in FIG. 5, the bending state of the first cover 141 and the second cover 142 shown in FIG. 4 allows the third shaft L3 to provide a force F to help the cable 170 to be bended so it is easy for the cable 170 to be received.

In summary, since the first electronic module 110 and the second electronic module 120 are structures that support each other via the hinges 150 and 160, in comparisons, the cover (including the first cover 141 and the second cover 142) of the covering structure for cable 140 is a driven element that is driven by the first electronic module 110 and the second electronic module 120 without any force-receiving or force-applying function (relative to the first electronic module 110 and the second electronic module 120).

Figure 8:
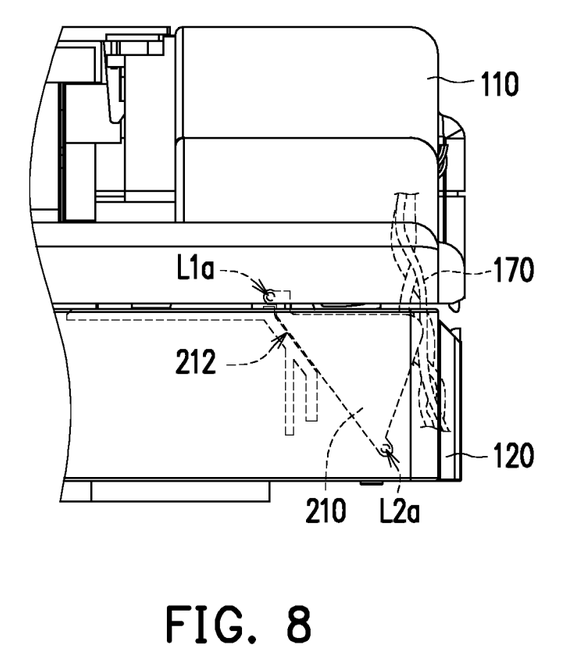
FIG. 8 and FIG. 9 are side views respectively illustrating a covering structure for cable according to another embodiment of the disclosure.
Figure 9:
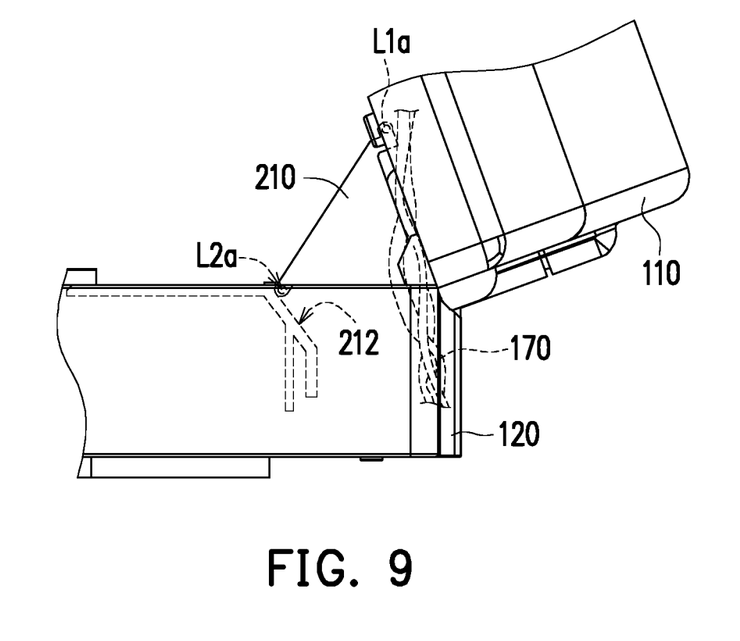

FIG. 8 and FIG. 9 are side views respectively illustrating a covering structure for cable according to another embodiment of the disclosure, which are similar to the states shown in FIG. 6 and FIG. 7. Therefore, the same components or structural feature are not repeated herein. Different from the two-piece cover shown in the previous embodiment, the covering structure for cable in the embodiment merely includes a single cover 210 which is pivoted to the first electronic module 110 in a fixed manner via a first shaft L1a, and movably pivoted to the second electronic module 120 via a second shaft L2a.

Specifically, the second electronic module 120 in the embodiment similarly has a recess and a track 212 disposed in the recess, and the track 212 is inclined relative to the supporting plane (the same as the X-Y plane described in the previous embodiment) of the second electronic module 120; meanwhile, the track 212 is extended into the second electronic module 120 from the supporting plane. The track 212 has a first end adjacent to the supporting plane and a second end located in (the recess) of the second electronic module 120, wherein an orthogonal projection of the first end on the supporting plane is farther from the pivotal axial direction than an orthogonal projection of the second end on the supporting plane is. In other words, the inclining direction of the track 212 is extended and inclined toward the hinges 150 and 160 from the supporting plane of the second electronic module 120, and the track 212 is substantially an inclined plane such that the second shaft L2a can simply lean against and move back and forth on the inclined plane, thereby achieving the movement effect that the second shaft L2a can be moved and pivoted.

As compared with the two-piece cover in the previous embodiment, the embodiment uses the one-piece cover 210 that is rigid and unfoldable and driven by the first electronic module 110 to be lifted from the recess of the second electronic module 120 to provide the covering and protecting effects to the cable 170.

In summary, in the embodiment of the disclosure, the covering structure for cable consists of at least one cover, the first shaft and the second shaft, wherein the cover is pivoted to the first electronic module via the first shaft, the cover is also movably pivoted to the second electronic module via the second shaft. Therefore, the cover is driven at the same time while the first electronic module is pivoted relative to the second electronic module to be opened/closed. Accordingly, when the first electronic module is opened relative to the second electronic module, the cable that is electrically connected between the first electronic module and the second electronic module is exposed; nevertheless, since the cover is driven at the same time, the portion of the cable that is exposed can be covered. In this manner, the cover is capable of providing covering and protecting functions for the appearance of the cable, thereby improving the service life of the cable and enhancing appearance of the electronic module.

Moreover, the at least one cover further includes the first cover and the second cover that are pivoted to each other, wherein the first cover is pivoted to the first electronic module in a fixed manner via the first shaft, and the second cover is movably pivoted to the second electronic module via the second shaft, thereby forming a two-piece linkage structure, which can similarly provide the covering and protecting functions for the cable smoothly like the one-piece rigid cover.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A covering structure for cable, adaptable for connecting between a first electronic module and a second electronic module, the first electronic module adaptable for being pivoted relative to the second electronic module to be opened/closed, the first electronic module and the second electronic module being electrically connected via a cable, and when the first electronic module being pivoted relative to the second electronic module to be opened, a portion of the cable being exposed outside the first electronic module and the second electronic module, the covering structure for cable comprising:
   at least a cover;
   a first shaft, disposed on a side of the cover, the first shaft being pivoted to the first electronic module; and
   a second shaft, disposed on another side of the cover and being opposite to the first shaft, the second shaft being movably pivoted to the second electronic module, wherein the second electronic module has a track, and the second shaft is pivoted to and moves along the track,
   wherein in a process that the first electronic module is opened/closed relative to the second electronic module, the cover is driven via the first shaft and the second shaft, such that the cover covers a portion of the cable that is exposed outside the first electronic module and the second electronic module when the first electronic module is opened relative to the second electronic module.

2. The covering structure for cable according to claim 1, wherein at least a hinge is connected between the first electronic module and the second electronic module and disposed at a position different from the covering structure for cable, the first electronic module is opened/closed relative to the second electronic module via the hinge and drives at least a portion of the cover to move out of or move into the second electronic module.

3. The covering structure for cable according to claim 1, wherein the first electronic module is an automatic document feeder (ADF) of a peripheral machine, and the second electronic module is a scanner or a copy machine of the peripheral machine.

4. The covering structure for cable according to claim 1, wherein the first electronic module is opened/closed relative to the second electronic module along a pivotal axial direction, and the first shaft, the second shaft and the pivotal axial direction are parallel with each other.

5. The covering structure for cable according to claim 1, wherein the second electronic module has a supporting plane, the first electronic module leans against the supporting plane in a closed state, an orthogonal projection of the first shaft on the supporting plane, an orthogonal projection of the second shaft on the supporting plane and an orthogonal projection of the pivotal axial direction on the supporting plane are respectively perpendicular to an orthogonal projection of the track on the supporting plane.

6. The covering structure for cable according to claim 5, wherein the first electronic module is opened/closed relative to the second electronic module along a pivotal axial direction, the track has a first end adjacent to the supporting plane and a second end located in the second electronic module, wherein an orthogonal projection of the first end on the supporting plane is farther from the pivotal axial direction than an orthogonal projection of said second end on the supporting plane is.

7. The covering structure for cable according to claim 1, wherein the track is inclined relative to a supporting plane of the second electronic module, when the first electronic module is closed relative to the second electronic module, the first electronic module leans against the supporting plane, and the track is extended into the second electronic module from the supporting plane.

8. The covering structure for cable according to claim 1, wherein the cover is rigid and unfoldable.

9. The covering structure for cable according to claim 1, wherein the track is parallel with a supporting plane of the second electronic module, when the first electronic module is closed relative to the second electronic module, the first electronic module leans against the supporting plane.

10. The covering structure for cable according to claim 9, wherein the track is lower than the supporting plane and has a stage.

11. The covering structure for cable according to claim 1, wherein the at least one cover comprises a first cover and a second cover, the first shaft is disposed on the first cover, the second shaft is disposed on the second cover, and the covering structure for cable further comprises a third shaft, the first cover and the second cover are pivoted together via the third shaft.

12. The covering structure for cable according to claim 11, wherein the first shaft, the second shaft and the third shaft are parallel with each other.

* * * * *